United States Patent
Hirota

(10) Patent No.: US 9,865,327 B1
(45) Date of Patent: Jan. 9, 2018

(54) SEMICONDUCTOR MEMORY APPARATUS

(71) Applicant: Powerchip Technology Corporation, Hsinchu (TW)

(72) Inventor: Akihiro Hirota, Tokyo (JP)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 15/470,909

(22) Filed: Mar. 28, 2017

(30) Foreign Application Priority Data

Nov. 4, 2016 (JP) .................. 2016-216449

(51) Int. Cl.
| G11C 7/00 | (2006.01) |
| G11C 11/4091 | (2006.01) |
| G11C 11/406 | (2006.01) |
| G11C 11/4096 | (2006.01) |
| G11C 11/4074 | (2006.01) |
| G11C 29/12 | (2006.01) |

(52) U.S. Cl.
CPC ...... *G11C 11/4091* (2013.01); *G11C 11/4074* (2013.01); *G11C 11/4096* (2013.01); *G11C 11/40611* (2013.01); *G11C 29/12* (2013.01)

(58) Field of Classification Search
CPC .. G11C 7/06; G11C 7/065; G11C 7/08; G11C 7/1039
USPC ........................................ 365/205, 196, 226
See application file for complete search history.

(56) References Cited

U.S. PATENT DOCUMENTS

| 8,300,480 B2 | 10/2012 | Furutani | |
| 2008/0015674 A1 | 1/2008 | Austin et al. | |
| 2009/0016139 A1* | 1/2009 | Teramoto | G11O 5/14 365/226 |
| 2011/0080797 A1* | 4/2011 | Furutani | G11C 7/02 365/205 |

FOREIGN PATENT DOCUMENTS

| JP | 2008159188 | 7/2008 |
| JP | 2011081755 | 4/2011 |

* cited by examiner

Primary Examiner — Han Yang
(74) Attorney, Agent, or Firm — JCIPRNET

(57) ABSTRACT

A semiconductor memory apparatus performs a selection in a normal readout/write-in mode and an automatic refreshing mode and includes a sense amplifier reading out data from a memory device, a first switching device connecting a first power supply voltage acting as an overdrive voltage to a first power supply intermediate node during a first period and then connecting a second power supply voltage acting as an array voltage to the first power supply intermediate node, a second switching device connecting the fourth power supply voltage to a second power supply intermediate node of the sense amplifier when the sense amplifier is driven, a first capacitor connected to the overdrive voltage and charging it, a third switching device switched on in the automatic refreshing mode, and a voltage generator generating a third power supply voltage and applying it and the first power supply voltage in parallel through the third switching device.

12 Claims, 12 Drawing Sheets

SEMICONDUCTOR MEMORY APPARATUS

CROSS-REFERENCE TO RELATED APPLICATION

This application claims the priority benefit of Japan application serial no. 2016-216449, filed on Nov. 4, 2016. The entirety of the above-mentioned patent application is hereby incorporated by reference herein and made a part of this specification.

FIELD OF THE INVENTION

The invention relates to a semiconductor memory apparatus, e.g., a synchronous dynamic random access memory (SDRAM).

DESCRIPTION OF RELATED ART

FIG. 1 is a circuit chart of an exemplary configuration of a memory circuit of a SDRAM in Conventional Example 1. In FIG. 1, the memory circuit in Conventional Example 1 includes a memory cell MC, a sense amplifier SA30, an overdrive voltage generator (referred to as "VOD voltage generator" hereinafter) 11, an array voltage generator (referred to as "VARY" voltage generator hereinafter) 12, a switching device 13, a switching device 14, and a capacitor 15 having a capacitance C1.

In FIG. 1, the memory cell MC includes a memory capacitor Ccell constituting a memory device and a selective metal oxide semiconductor (MOS) transistor Q10. One terminal of the memory capacitor Ccell is connected to a source of the MOS transistor Q10 through a storage node Ns, and the other terminal of the memory capacitor Ccell is connected to a predetermined voltage VCP. A gate of the MOS transistor Q10 is connected to a word line WL, and a drain of the MOS transistor Q10 is connected to, for example, a bit line BLB. Here, in the memory circuit of the SDRAM, plural memory cells MC are disposed in a lattice shape in directions of the word line WL, a bit line BL, and the bit line BLB.

The sense amplifier SA30 is formed by connecting a first complementary metal oxide semiconductor (CMOS) inverter including a MOS transistor Q1 and a MOS transistor Q2 and a second CMOS inverter including a MOS transistor Q3 and a MOS transistor Q4 to constitute a flip-flop of a positive feedback loop. Each of sources of the MOS transistor Q1 and the MOS transistor Q3 is connected at a power supply intermediate node P1. The power supply intermediate node P1 is connected to the array voltage generator 12 generating an array voltage VARY by performing a voltage step-down conversion on a power supply voltage VDD through a connecting point b of the switching device 14 (e.g., including the MOS transistor) switched on or off through a control signal SW2. In addition, the power supply intermediate node P1 is connected to a capacitor 15 having a capacitance C1 and the VOD voltage generator 11 generating an overdrive voltage VOD by performing the voltage step-down conversion on the power supply voltage VDD through a connecting point a of the switching device 14.

Besides, each of sources of the MOS transistor Q2 and the MOS transistor Q4 is connected at a power supply intermediate node P2. The power supply intermediate node P2 is grounded at a ground potential VSS through the switching device 13 (e.g., including the MOS transistor) switched on or off through a control signal SW1 (a reverse signal of the control signal SW2).

In a circuit of the sense amplifier formed by applying the foregoing method, the sense amplifier SA30 has two voltages VOD and VARY. Moreover, the power supply intermediate node P1 may be connected to any one of the overdrive voltage VOD and the array voltage VARY through the switching device 14. Furthermore, the power supply intermediate node P2 may be connected to the ground potential VSS through the switching device 13. Here, the array voltage VARY is a voltage lower than the overdrive voltage VOD and may be set to the maximum memorable level in a storage node Ns of the memory cell MC from an aspect of reliability of the memory cell MC. Nevertheless, the array voltage VARY is overly low in terms of rapidly sensing voltages on a bit line BL and the bit line BLB. Therefore, the overdrive voltage VOD has to be set to be higher than the array voltage VARY, so as to sense the voltages on the bit line BL and the bit line BLB rapidly.

When the sense amplifier SA30 starts sensing, the selective MOS transistor Q10 is switched on through a word line WL, and the memory cell MC is selected. And, a voltage Vns of the storage node Ns corresponding to a data value of the memory capacitor Ccell is transmitted to, for example, the bit line BLB through the MOS transistor Q10. Then, the power supply intermediate node P2 is connected to the ground potential VSS, and the power supply intermediate node P1 is connected to the overdrive voltage VOD. Here, electric charges are kept in the capacitor 15 and are disposed for performing a rapid sensing. Even if the number of the sense amplifier SA30 is changed, a capacitance of the capacitor 15 remains unchanged.

Next, not until a higher bit line voltage VBL gradually approaches the array voltage VARY and substantially becomes the array voltage VARY does the power supply intermediate node P1 have to be connected to the overdrive voltage VOD. Afterwards, the higher bit line voltage VBL is connected to the array voltage VARY to maintain the array voltage VARY. Here, the activated sense amplifier SA30 amplifies a voltage VBLB of a data value transmitted to the bit line BLB.

RELATED ART

Patent Literature

[Patent Literature 1] Japanese Patent Publication No. 2011-081755
[Patent Literature 2] U.S. Pat. No. 8,300,480
[Patent Literature 3] Japanese Patent Publication No. 2008-159188
[Patent Literature 4] US Patent Publication No. 2008/015674

Problem to be Solved

Optimization of the capacitance C1 of the capacitor 15 relative to a normal readout/write-in mode is described hereinafter.

FIG. 2A is a timing chart of actions of the memory circuit in FIG. 1 in a normal readout/write-in mode (C1 being optimized). In addition, FIG. 2B is a timing chart of actions of the memory circuit in FIG. 1 in an automatic refreshing mode. As clearly shown in FIG. 2A and FIG. 2B, plural bit lines BL and bit lines BLB have to be charged in the automatic refreshing mode, and thus a sensing speed in the automatic refreshing mode is slower than that in the normal readout/write-in mode (51 and 52). Besides, each of the sense amplifiers SA30 consumes higher amount of currents in the automatic refreshing mode than in the normal readout/write-in mode (53). The reason is that a period during which the bit lines BL and the bit lines BLB acting as half-value levels is further prolonged, and flow-through currents of the sense amplifier SA30 become greater at the same time.

Moreover, optimization of the capacitance C1 of the capacitor 15 relative to the automatic refreshing mode is described hereinafter.

FIG. 3A is a timing chart of actions of the memory circuit in FIG. 1 in a normal readout/write-in mode. In addition, FIG. 3B is a timing chart of actions of the memory circuit in FIG. 1 in the automatic refreshing mode (C1 being optimized). As clearly shown in FIG. 3A and FIG. 3B, the capacitance C1 of the capacitor 15 is overly charged in the normal readout/write-in mode; as a result, the higher bit line voltage VBL becomes overcharged (54). In addition, excessive electric charges have to be discharged in the normal readout/write-in mode, such that the overall amount of currents consumed by the sense amplifier SA30 further becomes higher in the normal readout/write-in mode (55).

As mentioned above, there are several problems in Conventional Example 1: the capacitance C1 of the capacitor 15 is unable to be optimized relative to both of the normal readout/write-in mode and the automatic refreshing mode, and the amount of currents consumed by the sense amplifier SA30 further becomes higher in either mode.

Problems found in a memory circuit in Conventional Example 2 are described hereinafter. Note that the memory circuit in Conventional Example 2 is also the memory circuit depicted in FIG. 1.

FIG. 4A is a timing chart of actions taken when a consumed current I is greater than a previously simulated evaluation value in the memory circuit in Conventional Example 2. In addition, FIG. 4B is a timing chart of actions taken when the consumed current I is less than a previously simulated evaluation value in the memory circuit in Conventional Example 2.

As clearly shown in FIG. 4A, when the consumed current I is greater than the previously simulated evaluation value, an actual overdrive voltage VODa is lower than the original overdrive voltage VOD, and an actual sensing speed of the sense amplifier SA30 is slower than an estimated value. In addition, a period during which the bit line voltage VBL and a bit line voltage VBLB acting as the half-value levels are prolonged (VBLa and VBLBa), and thus a consumed current Ia of each of the sense amplifiers SA30 in actual devices becomes greater (56). At this time, the flow-through currents of the sense amplifiers SA30 increase. Under such circumstances, the capacitance C1 of the capacitor 15 used for the overdrive voltage VOD is adjusted to be greater than a default value.

On the contrary, as clearly shown in FIG. 4B, when the consumed current I is less than the previously simulated evaluation value, the actual overdrive voltage VODa is higher than the original overdrive voltage VOD, and the bit line voltage VBL and the array voltage VARY are greater than target values (VBLa and VARYa). In addition, residual electric charges should be discharged by the overly-charged bit line voltage VBL and array voltage VARY, and the consumed current (Ia) of each of the sense amplifiers SA30 in actual devices becomes higher (57). Under such circumstances, the capacitance C1 of the capacitor 15 used for the overdrive voltage VOD is adjusted to be less than the default value.

As mentioned above, there are problems in Conventional Example 2: the capacitance C1 of the capacitor 15 is unable to be optimized in the normal readout/write-in mode and in the auto refreshing mode, and the current consumed by the sense amplifier SA30 increases.

In addition, there are also problems in Conventional Example 2: the capacitance C1 of the capacitor 15 used for the overdrive voltage VOD is unable to be optimized if the capacitance C1 of the capacitor 15 is different from the evaluation value, and the current consumed by the sense amplifier SA30 increases.

SUMMARY OF THE INVENTION

The invention provides solutions to said problems and provides a semiconductor memory apparatus for optimizing a capacitance of a capacitor used for an overdrive voltage and reducing a current consumed by a sense amplifier as compared to existing technologies.

Solutions to the Problems

In an embodiment of the invention, a semiconductor memory apparatus performs a selection action in a normal readout/write-in mode and in an automatic refreshing mode and includes:

a sense amplifier, having a first power supply intermediate node and a second power supply intermediate node and reading out data from a memory device connected to a word line and a bit line;

a first switching device, connecting a first power supply voltage acting as an overdrive voltage to the first power supply intermediate node of the sense amplifier when the sense amplifier is driven during a first period, and then connecting a second power supply voltage lower than the first power supply voltage and acting as an array voltage to the first power supply intermediate node of the sense amplifier when the sense amplifier is driven during a second period;

a second switching device, connecting the predetermined fourth power supply voltage to the second power supply intermediate node of the sense amplifier when the sense amplifier is driven;

a first capacitor, connected to the overdrive voltage and charging the overdrive voltage;

a third switching device, switched on when the semiconductor memory apparatus is in the automatic refreshing mode; and a voltage generator, generating a third power supply voltage substantially identical to the first power supply voltage, wherein the voltage generator applies the third power supply voltage and the first power supply voltage in parallel through the third switching device.

In an embodiment of the invention, the semiconductor memory apparatus further includes a second capacitor, and the second capacitor is connected to the third power supply voltage and charges the third power supply voltage.

In addition, in an embodiment of the invention, if the number of the sense amplifier activated when the semiconductor memory device is in the automatic refreshing mode is configured to be A, the number of the sense amplifier activated when the semiconductor memory device is in the normal readout/write-in mode is configured to be N, a capacitance of the first capacitor is configured to be C1, and a capacitance of the second capacitor is configured to be C2, the capacitances C1 and C2 are configured to satisfy the following equation, $$A/N=(C1+C2)/C1.$$

In an embodiment of the invention, in the semiconductor memory apparatus, the third switching device is an MOS transistor.

In an embodiment of the invention, in the semiconductor memory apparatus, the third switching device has a driving capability to fully discharge electric charges of the second capacitor.

In an embodiment of the invention, in the semiconductor memory apparatus, the third switching device is switched on when the semiconductor memory apparatus is in the automatic refreshing mode and switched off when the semiconductor memory apparatus is in the normal readout/write-in mode according to a predetermined mode signal.

In another embodiment of the invention, a semiconductor memory apparatus includes:

a sense amplifier, having a first power supply intermediate node and a second power supply intermediate node and reading out data from a memory device connected to a word line and a bit line;

a first switching device, during a first period when the sense amplifier is driven, the first switching device connecting a first power supply voltage acting as an overdrive voltage to the first power supply intermediate node of the sense amplifier and then connecting a second power supply voltage lower than the first power supply voltage and acting as an array voltage to the first power supply intermediate node;

a second switching device, connecting the predetermined fourth power supply voltage to the second power supply intermediate node of the sense amplifier when the sense amplifier is driven;

a first capacitor, connected to the overdrive voltage and charging the overdrive voltage;

a plurality of third switching devices, each having one terminal connected to the first capacitor;

a plurality of second capacitors, connected respectively to the other terminals of the third switching devices; and a control circuit, generating a plurality of control signals to control a switch-on action or a switch-off action of the third switching devices.

In another embodiment of the invention, in the semiconductor memory apparatus, the third switching devices are MOS transistors, respectively.

In another embodiment of the invention, in the semiconductor memory apparatus, the third switching devices have a driving capability to fully charge or discharge electric charges of the second capacitors.

In another embodiment of the invention, in the semiconductor memory apparatus, the control circuit includes a plurality of fuses and cuts off the predetermined fuses, so as to output a plurality of fuse signals acting as the control signals to the third switching devices.

In another embodiment of the invention, in the semiconductor memory apparatus, a plurality of internal testing signals acting as the control signals are outputted to the third switching devices by the control circuit during an internal testing of the semiconductor memory device.

In another embodiment of the invention, in the semiconductor memory apparatus, capacitances of the second capacitors are determined according to methods that are identical to or different from one another.

Effects of the Invention

Thus, according to the semiconductor memory apparatus provided by embodiments of the invention, the capacitance of the capacitor used for the overdrive voltage may be optimized, and the currents consumed by the sense amplifier may be reduced as compared to existing technologies.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
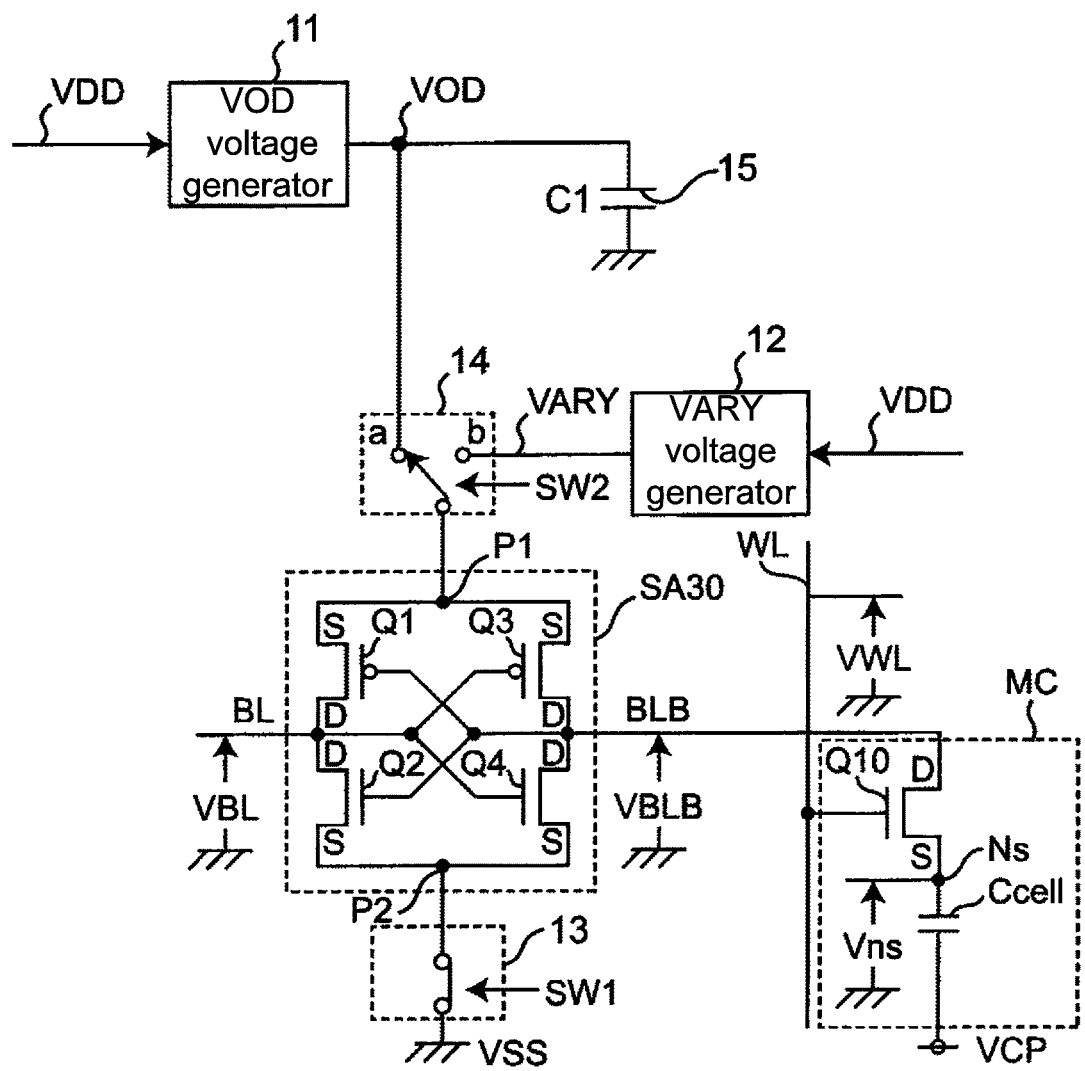
FIG. 1 is a circuit chart of an exemplary configuration of a memory circuit of a SDRAM in Conventional Example 1.
Figure 2A:
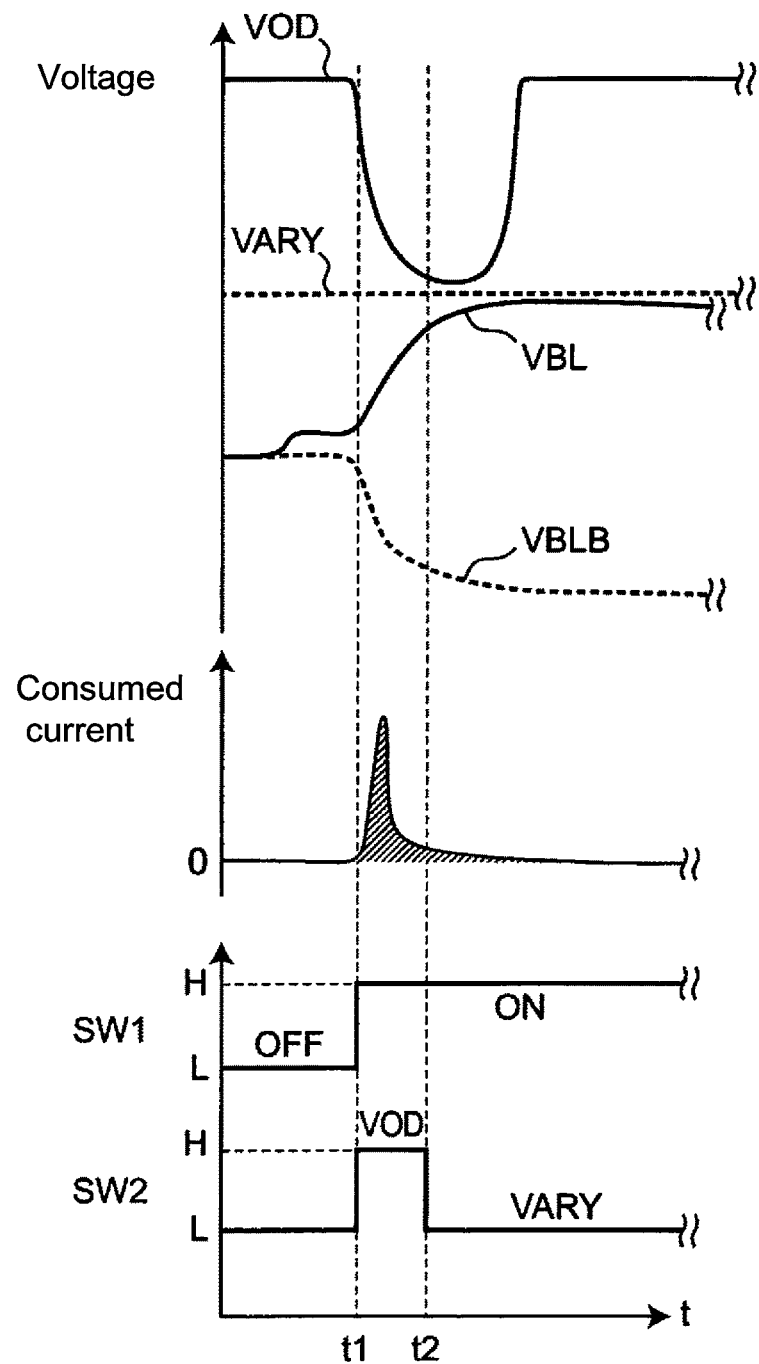
FIG. 2A is a timing chart of actions of the memory circuit in FIG. 1 in a normal readout/write-in mode (C1 being optimized).
Figure 2B:
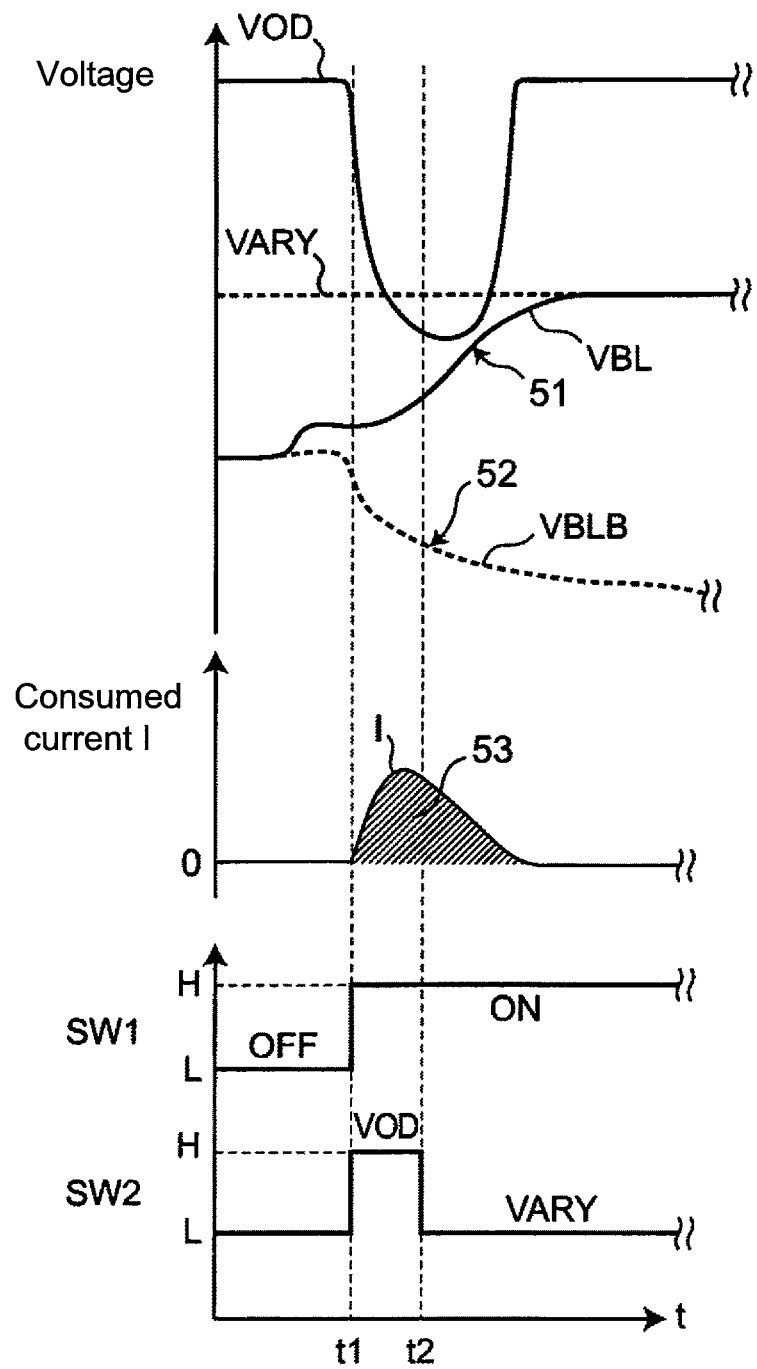
FIG. 2B is a timing chart of actions of the memory circuit in FIG. 1 in an automatic refreshing mode.
Figure 3A:
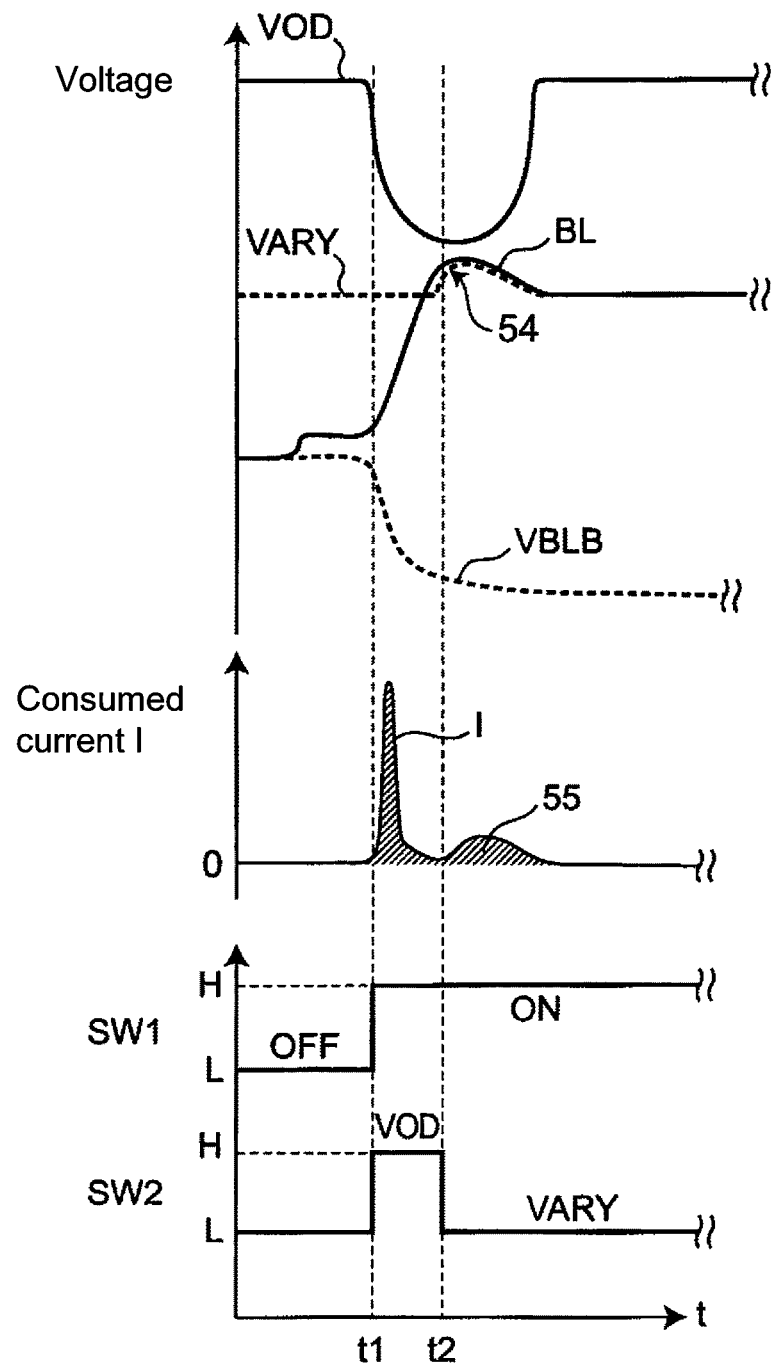
FIG. 3A is a timing chart of actions of the memory circuit in FIG. 1 in a normal readout/write-in mode.
Figure 3B:
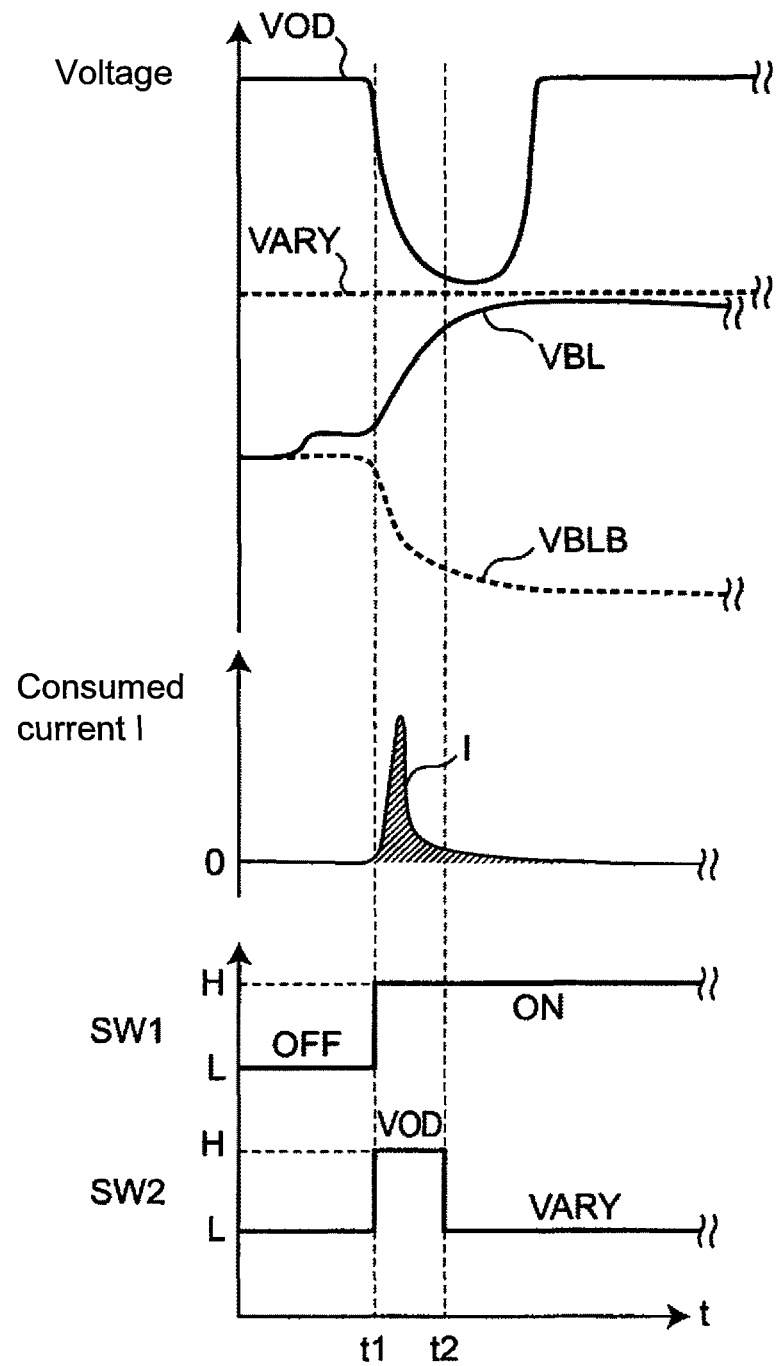
FIG. 3B is a timing chart of actions of the memory circuit in FIG. 1 in an automatic refreshing mode (C1 being optimized).
Figure 4A:
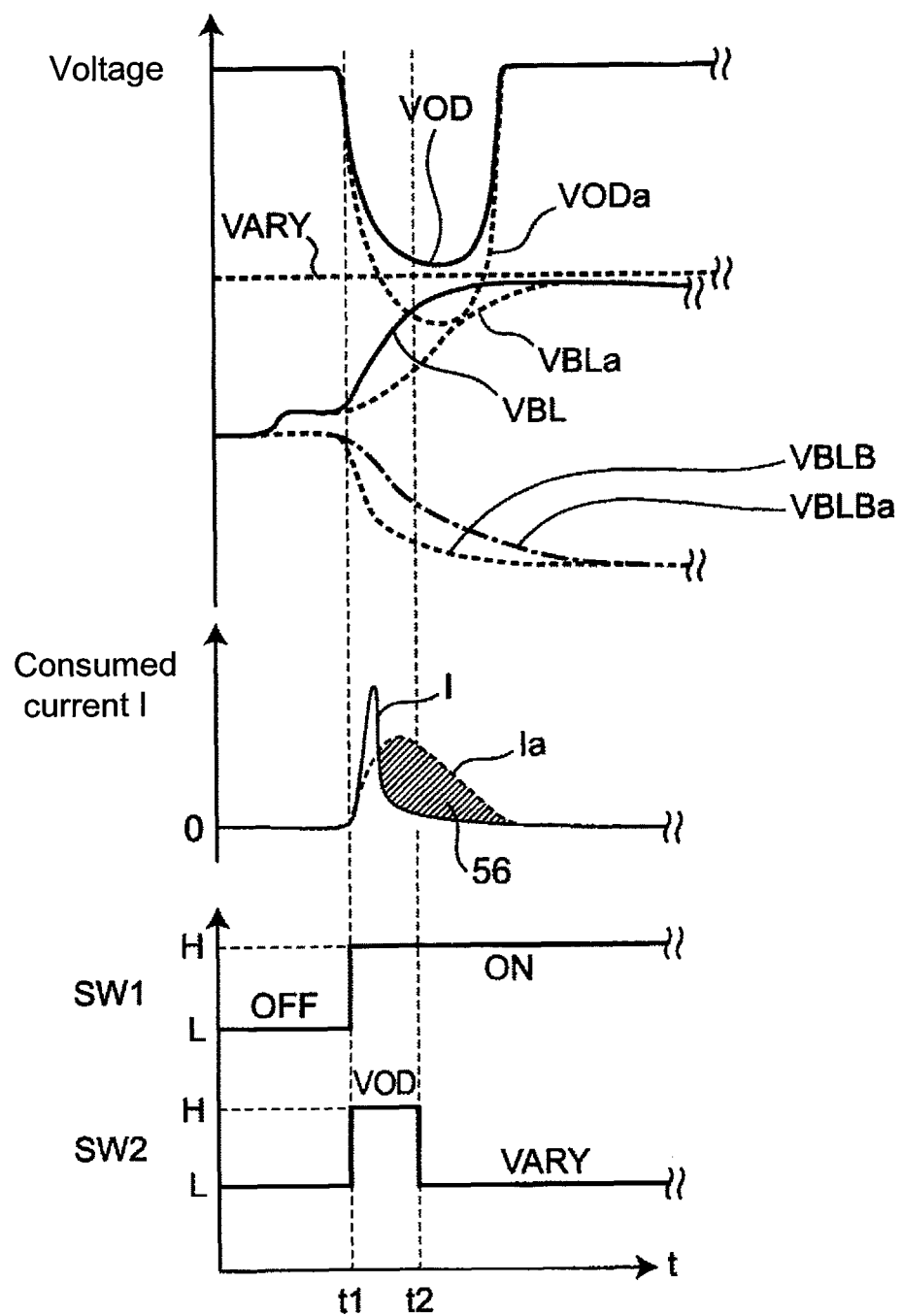
FIG. 4A is a timing chart of actions taken when a consumed current I is greater than a previously simulated evaluation value in the memory circuit in Conventional Example 2.
Figure 4B:
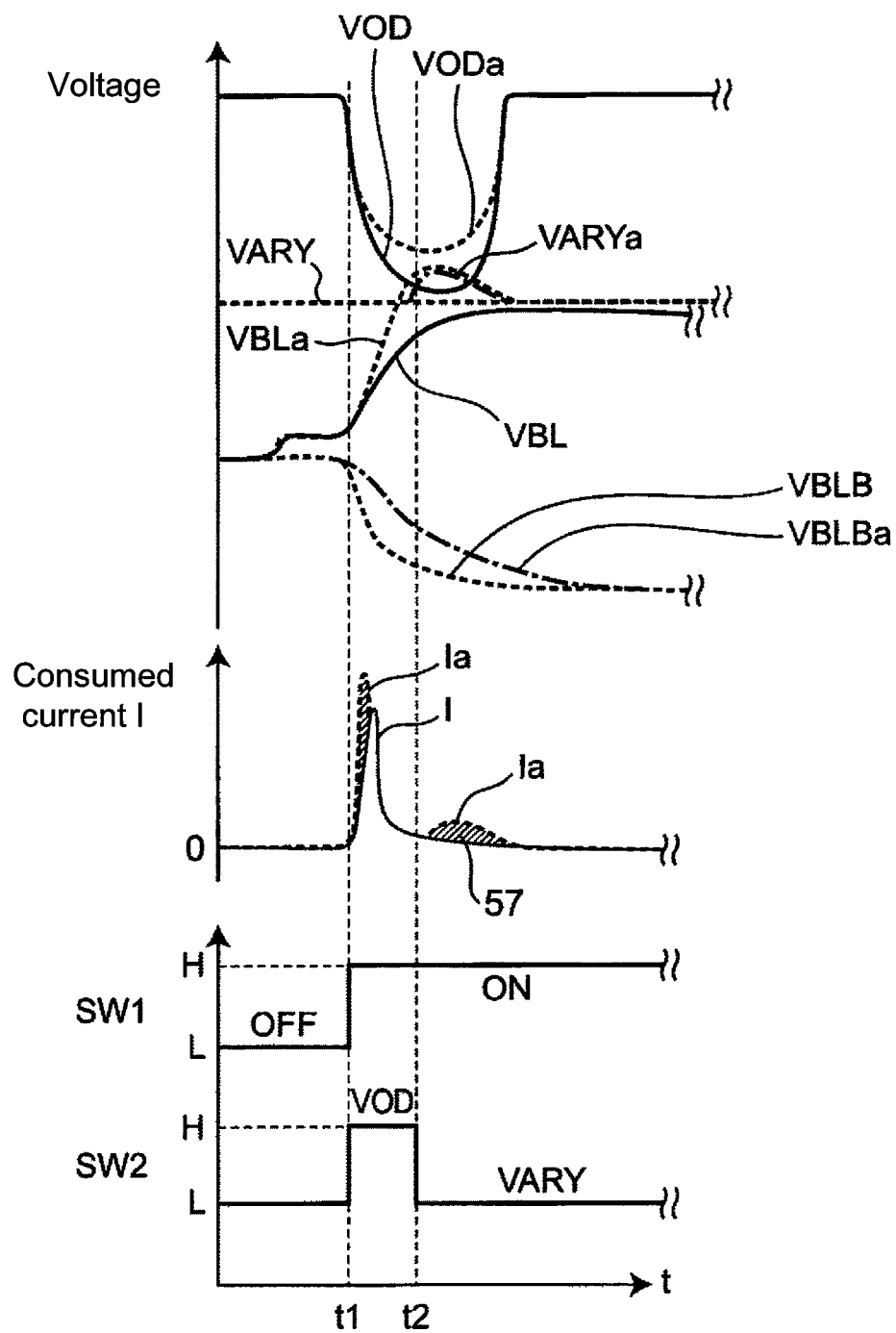
FIG. 4B is a timing chart of actions taken when the consumed current I is less than a previously simulated evaluation value in the memory circuit in Conventional Example 2.

Embodiments of the invention are described hereinafter with reference to the drawings. Moreover, in each of the following embodiments, identical components/elements are assigned with the same reference numerals.

Embodiment 1

Generally, the numbers of the sense amplifiers SA30 activated in the normal readout/write-in mode and in the refreshing mode are required to be different, and appropriate values of the capacitance C1 of the capacitor 15 used for the overdrive voltage VOD in the foregoing two modes are also required to be different. Therefore, in Embodiment 1, the capacitance C1 of the capacitor 15 used for the overdrive voltage VOD is automatically optimized in the two modes.

Figure 5:
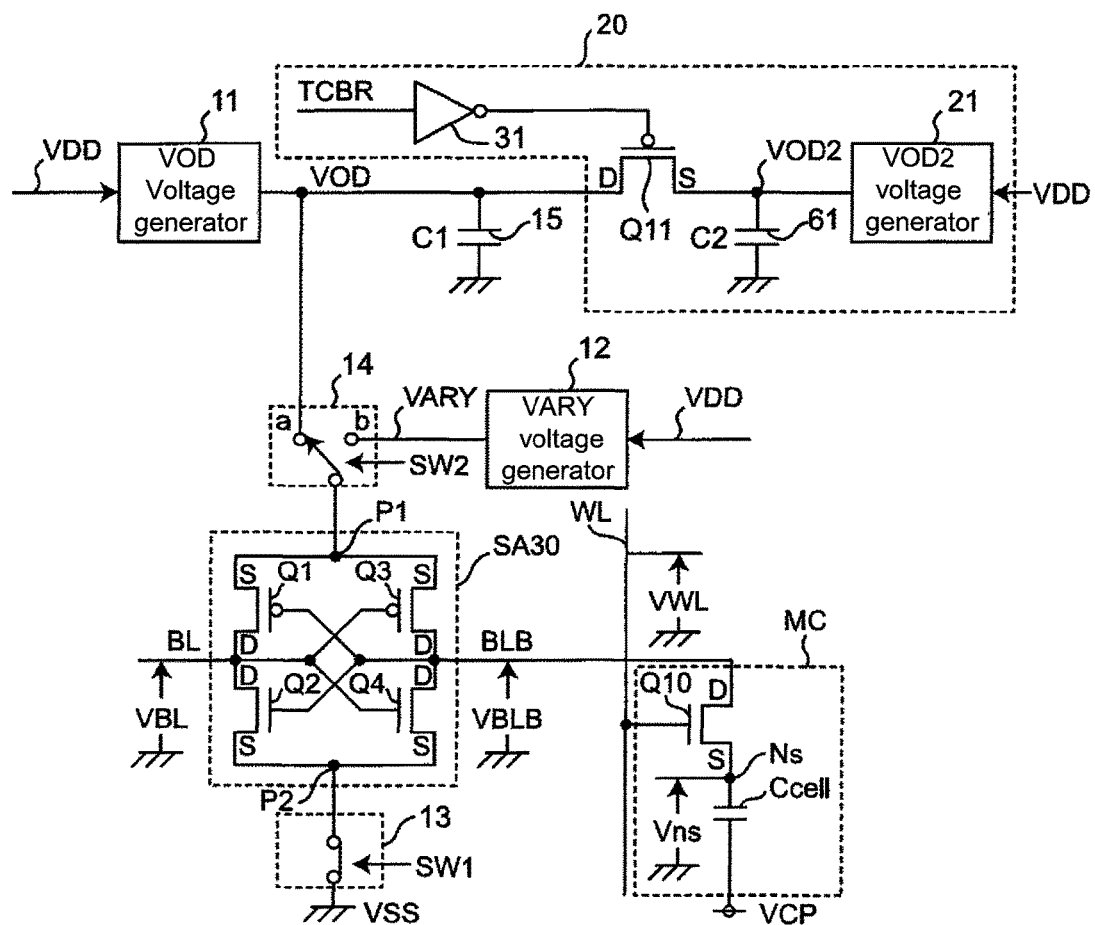
FIG. 5 is a circuit chart of an exemplary configuration of a memory circuit of a SDRAM in Embodiment 1.

FIG. 5 is a circuit chart of an exemplary configuration of a memory circuit of a SDRAM in Embodiment 1. In FIG. 5, the memory circuit provided by Embodiment 1 further includes a voltage generating circuit 20 as compared to the memory circuit provided by Conventional Example 1 in FIG. 1.

In FIG. 5, the memory cell MC includes a selective MOS transistor Q10 and a memory capacitor Ccell constituting a memory device. One terminal of the memory capacitor Ccell is connected to a source of the MOS transistor Q10 through a storage node Ns, and the other terminal of the memory capacitor Ccell is connected to a predetermined voltage VCP. A gate of the MOS transistor Q10 is connected to a word line WL, and a drain of the MOS transistor Q10 is connected to, for example, a bit line BLB. Here, in the memory circuit of the SDRAM, a plurality of memory cells MC are disposed in a lattice shape in directions of the word line WL, a bit line BLT, and the bit line BLB.

The sense amplifier SA30 is formed by connecting a first CMOS inverter including a MOS transistor Q1 and a MOS transistor Q2 and a second CMOS inverter including a MOS transistor Q3 and a MOS transistor Q4 to constitute a flip-flop of a positive feedback loop. Each of sources of the MOS transistor Q1 and the MOS transistor Q3 is connected at a power supply intermediate node P1. The power supply intermediate node P1 is connected to the array voltage generator 12 generating an array voltage VARY by performing a voltage step-down conversion on a power supply voltage VDD through a connecting point b of the switching device 14 (e.g., including the MOS transistor) switched on or off through a control signal SW2. In addition, the power supply intermediate node P1 is connected to a capacitor 15 having a capacitance C1 and the VOD voltage generator 11 generating an overdrive voltage VOD by performing the voltage step-down conversion on the power supply voltage VDD through a connecting point a of the switching device 14.

Besides, each of sources of the MOS transistor Q2 and the MOS transistor Q4 is connected at a power supply intermediate node P2. The power supply intermediate node P2 is grounded at a ground potential VSS through the switching device 13 (e.g., including the MOS transistor) switched on or off through a control signal SW1 (a reverse signal of the control signal SW2).

Furthermore, the voltage generating circuit 20 includes a VOD2 voltage generator 21, a capacitor 61 having a capacitance C2, a MOS transistor Q11 acting as the switching device, and an inverter 31. In FIG. 5, a mode signal TCBR becomes a low-level signal in the normal readout/write-in mode and becomes a high-level signal in the automatic refreshing mode. The mode signal TCBR is applied to a gate of the MOS transistor Q11 through the inverter 31. Here, the MOS transistor Q11 has a sufficient driving capability to discharge electric charges of the capacitor 61. The MOS transistor Q11 is switched off in the normal readout/write-in mode and switched on in the automatic refreshing mode. The VOD2 voltage generator 21 converts the power supply voltage VDD into a predetermined overdrive voltage VOD2 (substantially equal to the overdrive voltage VOD) through the voltage step-down conversion and applies the converted voltage to the connecting point a of the switching device 14 through the capacitor 61 grounded at the other terminal, the MOS transistor Q11, and the capacitor 15. Therefore, the overdrive voltage VOD2 charged to the capacitor 61 is applied in parallel to the overdrive voltage VOD by the voltage generating circuit 20 only in the automatic refreshing mode.

Furthermore, in Embodiment 1, the capacitance C1 of the capacitor 15 used for the overdrive voltage VOD is configured as an optimal value in advance in the normal readout/write-in mode in the previous simulation. In addition, in the two action modes, the capacitance C1 and the capacitance C2 have to be configured to be used as the capacitance in one sense amplifier SA30 and preferably determined by the following equation.

$$\frac{A}{N} = \frac{C1 + C2}{C1} \quad (1)$$

Here, A is the number of the sense amplifiers SA30 activated in one memory bank of the SDRAM in the automatic refreshing mode. In addition, N is the number of the sense amplifiers SA30 activated in one memory bank of the SDRAM in the normal readout/write-in mode.

Figure 6A:
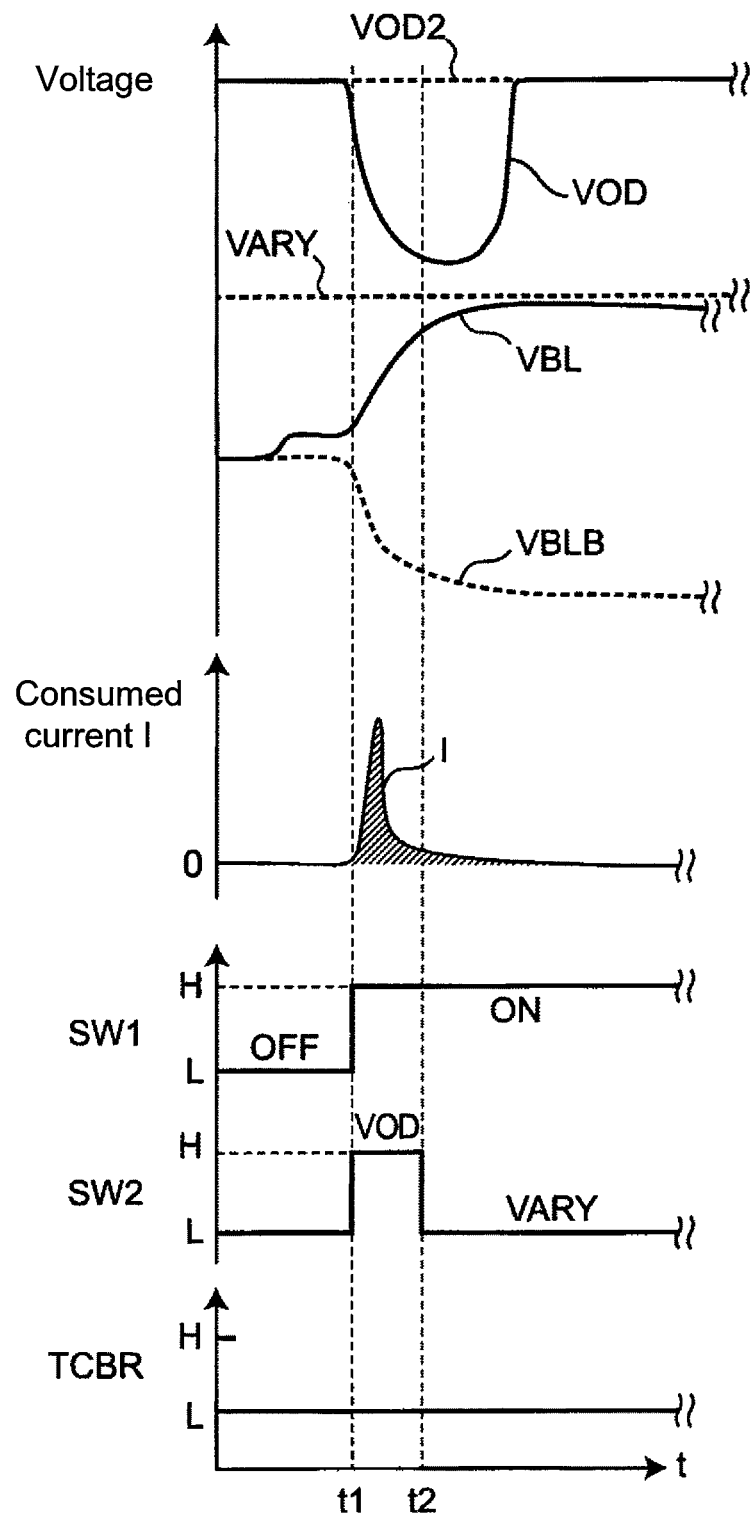
FIG. 6A is a timing chart of actions of the memory circuit in FIG. 5 in a normal readout/write-in mode (C1 being optimized).

FIG. 6A is a timing chart of actions of the memory circuit in FIG. 5 in a normal readout/write-in mode (C1 being optimized). As clearly shown in FIG. 6A, since the overdrive voltage VOD2 is not applied in the normal readout/write-in mode, and merely the overdrive voltage VOD is charged through the capacitance C1 of the capacitor 15, the sense amplifier SA30 operates in an optimized manner, and the consumed current I is not increased.

Figure 6B:
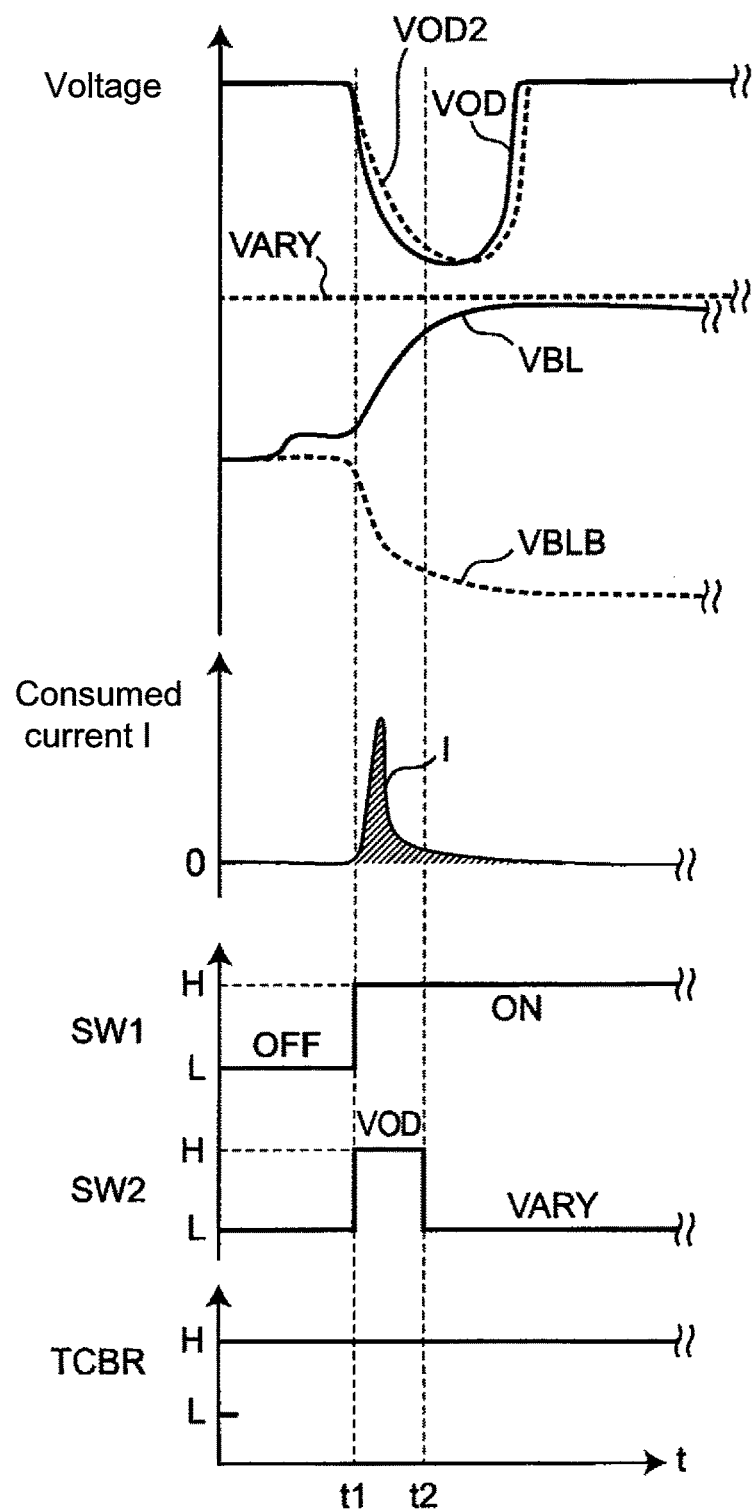
FIG. 6B is a timing chart of actions of the memory circuit in FIG. 5 in an automatic refreshing mode.

FIG. 6B is a timing chart of actions of the memory circuit in FIG. 5 in an automatic refreshing mode. According to FIG. 6B, since the overdrive voltage VOD2 is applied in the automatic refreshing mode, and the overdrive voltage VOD and the overdrive voltage VOD2 are charged through the capacitance C1 of the capacitor 15 and the capacitance C2 of the capacitor 61, the sense amplifier SA30 also operates in an optimized manner even in the automatic refreshing mode, and the consumed current I is not increased.

In view of the foregoing, according to Embodiment 1, substantially identical sensing speeds may be achieved in the two action modes, and the consumed currents are also reduced in the two modes. Hence, the capacitances used for the overdrive voltages may be optimized in the two modes.

In Embodiment 1, the power supply intermediate node P2 is grounded through the switching device 13, but the invention is not limited thereto. The power supply intermediate node P2 may also be connected to a power supply voltage lower than the array voltage VARY.

Embodiment 2

Figure 7:
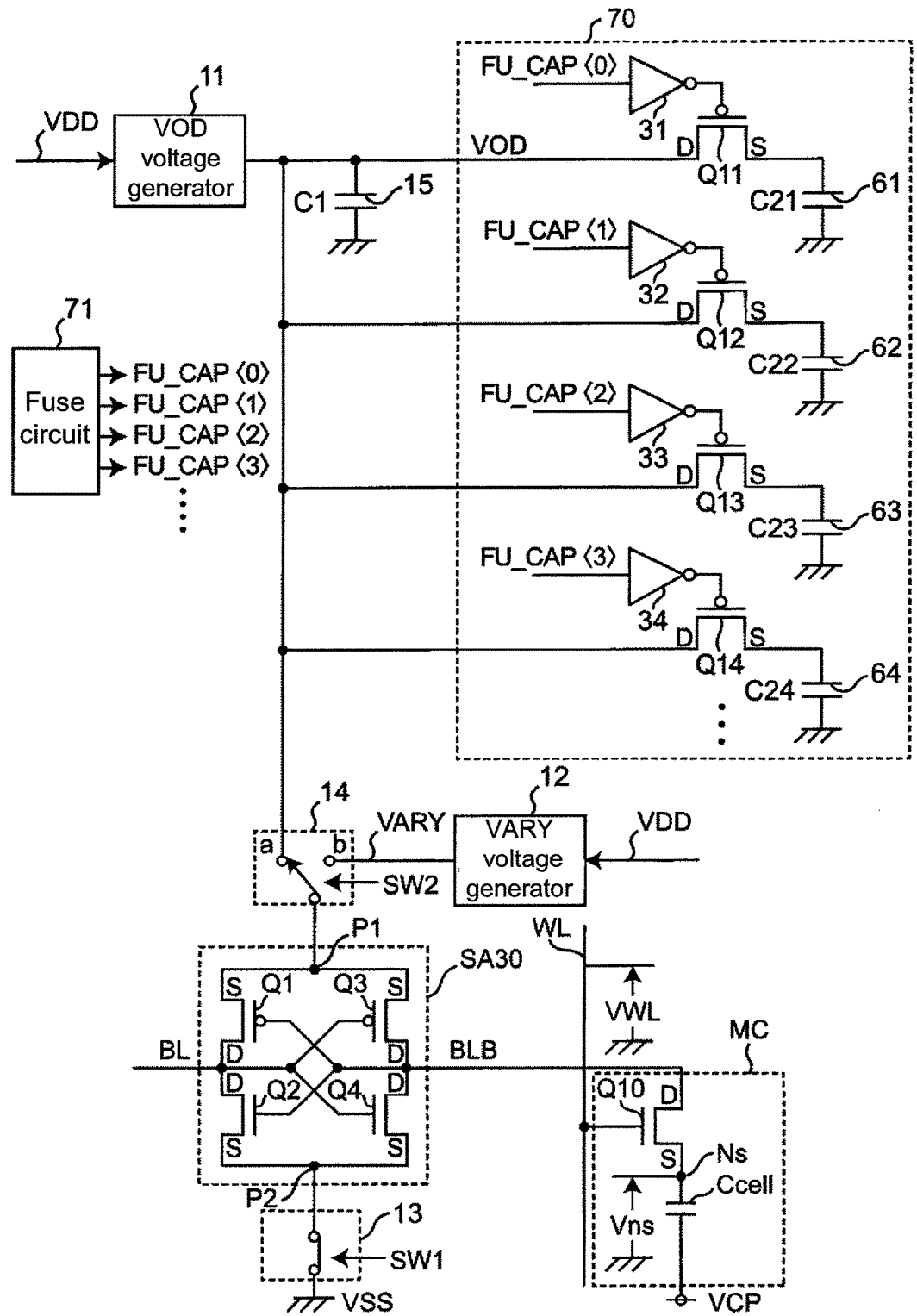
FIG. 7 is a circuit chart of an exemplary configuration of a memory circuit of a SDRAM in Embodiment 2.

FIG. 7 is a circuit chart of an exemplary configuration of a memory circuit of a SDRAM in Embodiment 2.

Referring to Conventional Example 2, as described above, it is possible that the necessary capacitance used for the overdrive voltage is different from the previously simulated evaluation value, such that the capacitance used for the overdrive voltage to lower the consumed current has to be optimized when the sensing speed is increased. Nevertheless, as shown in Conventional Example 2, generally, the capacitance is fixed and cannot be changed easily. In order to solve said problem, in FIG. 7 as compared to the memory circuit in FIG. 1, the memory circuit in Embodiment 2 is characterized in that a capacitance trimming circuit 70 and a fuse circuit 71 are included. A method of trimming the capacitance used for the overdrive voltage through cutting off fuses of the fuse circuit 71 is adopted in Embodiment 2. Differences between the circuit configuration in Embodiment 2 and the circuit configuration in FIG. 5 are described below.

In FIG. 7, the capacitance trimming circuit 70 includes the capacitor 61, a capacitor 62, a capacitor 63, a capacitor 64, and so forth used for the overdrive voltage VOD, the MOS transistor Q11, a MOS transistor Q12, a MOS transistor Q13, a MOS transistor Q14, and so forth acting as the switching devices, the inverter 31, an inverter 32, an inverter 33, an inverter 34, and so forth, and the fuse circuit 71. Here, the capacitor 61, the capacitor 62, the capacitor 63, the capacitor 64, and so forth have a capacitance C21, a capacitance C22, a capacitance C23, a capacitance C24, and so forth, respectively. Here, the capacitance C21, the capacitance C22, the capacitance C23, the capacitance C24, and so forth may be identical to or different from one another. If the capacitances are different from one another, the capacitances are determined by the following equation, for example.

$$C21 = C0$$

$$C22 = 2C0$$

$$C23 = 4C0$$

$$C24 = 8C0$$

. . .

The fuse circuit 71 includes a plurality of fuses. The capacitor 61, the capacitor 62, the capacitor 63, the capacitor 64, and so forth are allocated, and capacitances obtained by subtracting C1 from the previously simulated optimized evaluation capacitance are determined by the fuse circuit 71. Therefore, the corresponding fuses are cut off, and corresponding fuse signals FU_CAP<0>, FU_CAP<1>, FU_CAP<2>, FU_CAP<3>, and so forth are set to be high-level fuse signals, such that the corresponding MOS transistors Q11 to Q14 are switched on, and that the corresponding capacitors 61 to 64 are connected to the capacitor 15 in parallel. Thereby, the capacitances used for the overdrive voltage may be trimmed.

Here, the fuse signal FU_CAP<0>, the fuse signal FU_CAP<1>, the fuse signal FU_CAP<2>, the fuse signal FU_CAP<3>, and so forth are one form of control signals controlling a capacitances of the capacitance trimming circuit 70, and the fuse circuit 71 acts as a form of a control circuit controlling the capacitances of the capacitance trimming circuit 70. Therefore, the MOS transistors Q11 to Q14 have sufficient driving capabilities to charge or discharge electric charges of the capacitors 61 to 64.

In view of the foregoing, with the capacitance trimming circuit 70 described in the embodiment, the capacitances used for the overdrive voltage VOD may be trimmed. For example, the capacitances used for the overdrive voltage VOD may be trimmed according to the previously simulated optimized evaluation capacitance, and the optimized capacitance may thus be determined. As such, the capacitances used for the overdrive voltage may be trimmed with ease for the actual devices as compared to existing technologies.

Embodiment 3

Figure 8:
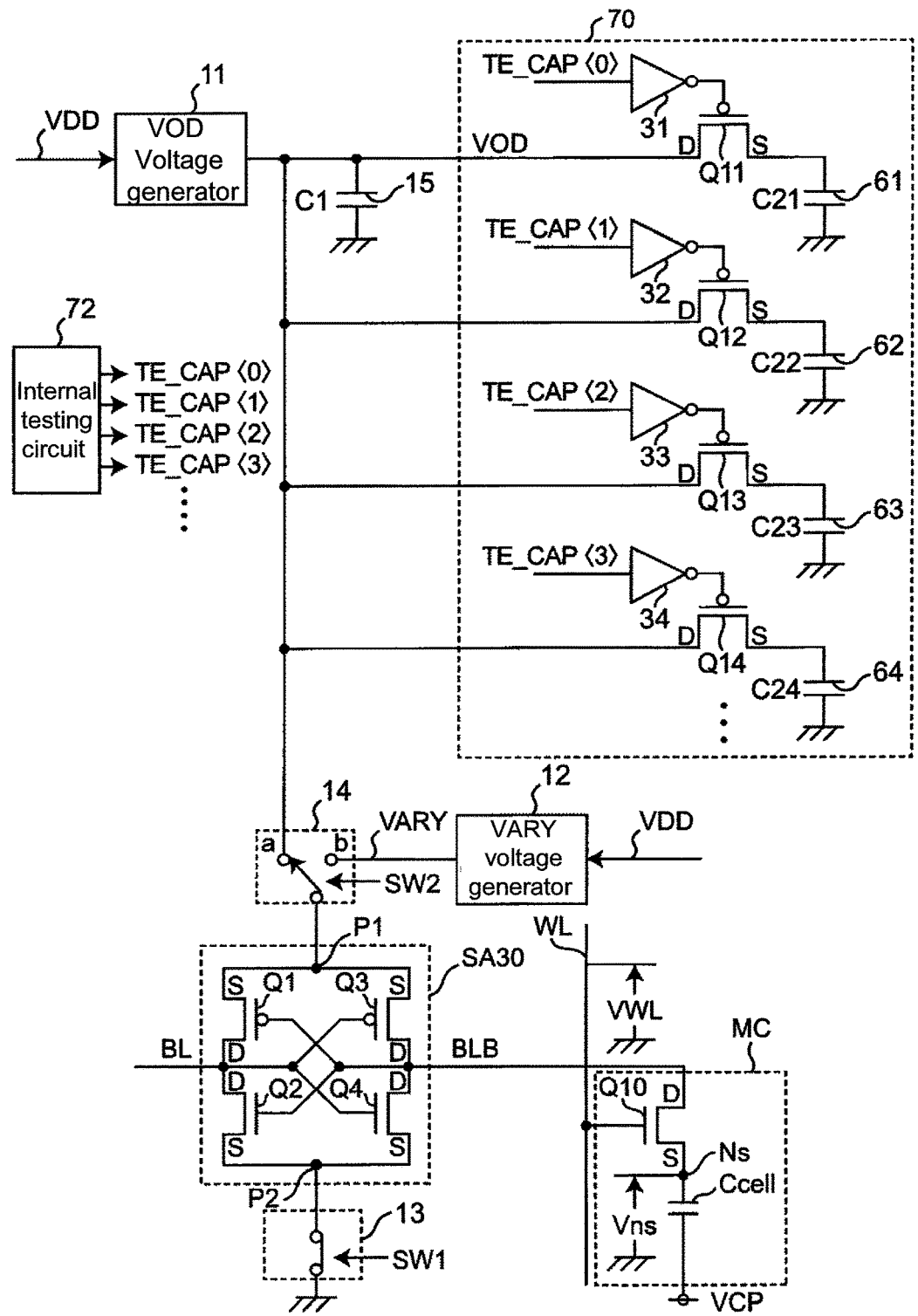
FIG. 8 is a circuit chart of an exemplary configuration of a memory circuit of a SDRAM in Embodiment 3.

FIG. 8 is a circuit chart of an exemplary configuration of a memory circuit of a SDRAM in Embodiment 3. Compared to the memory circuit provided by Embodiment 2 in FIG. 7, in the memory circuit provided by Embodiment 3 and shown in FIG. 8, the fuse circuit 71 is replaced, and an internal testing circuit 72 is included. Differences are described as follows.

In FIG. 8, the internal testing circuit 72 sets an internal testing signal TE_CAP<0>, an internal testing signal TE_CAP<1>, an internal testing signal TE_CAP<2>, an internal testing signal TE_CAP<3>, and so forth to be at high levels sequentially according to a predetermined order in the internal testing of the SDRAM, such that the corresponding MOS transistors Q11 to Q14 are switched on, and the corresponding capacitors 61 to 64 are connected to the capacitor 15 in parallel. Thereby, the capacitances used for the overdrive voltage VOD may be trimmed. Here, the capacitances used for the overdrive voltage are optimized in actual devices by the internal testing circuit 72 through, for example, maximizing the sensing speed of and minimizing the currents consumed by the sense amplifier SA30.

Moreover, the internal testing signal TE_CAP<0>, the internal testing signal TE_CAP<1>, the internal testing signal TE_CAP<2>, the internal testing signal TE_CAP<3>, and so forth are one form of the control signals controlling the capacitances of the capacitance trimming circuit 70. In addition, the internal testing circuit 72 is a form of a control circuit controlling the capacitances of the capacitance trimming circuit 70.

Differences between the invention and the related art
Differences between the invention and the Patent Literature 1 to the Patent Literature 4 are described as follows.

(1) Differences between the invention and the Patent Literature 1 and the Patent Literature 2

The Patent Literature 1 and the Patent Literature 2 disclose a semiconductor apparatus with a sense amplifier, and a boost circuit generating an overdrive voltage is configured to reduce the increase of the consumed power. Here, the semiconductor apparatus having the sense amplifier and supplied by an external power supply voltage has a driving signal wire connected to the sense amplifier, a boost circuit having a first voltage that is generated by and higher than the external power supply voltage, and a step-down circuit generating a second voltage by lowering the external power supply voltage. During a normal external access action, when a sensing action is executed by the sense amplifier, the first voltage is applied to the driving signal wire at the beginning of the sensing action, and then the second voltage is applied to the driving signal wire. On the contrary, during a refreshing action that is not perform together with the external access action, the operation of the boost circuit is terminated, such that the second voltage is applied to the driving signal wire at the beginning of the sensing action.

Therefore, the Patent Literature 1 and the Patent Literature 2 disclose that a capacitance used for the overdrive voltage is fixed. Nevertheless, the features of the invention including changing the capacitance in the normal readout/write-in mode and in the automatic refreshing mode and trimming and optimizing the capacitance are neither disclosed nor taught in the Patent Literature 1 and the Patent Literature 2.

(2) Differences between the invention and the Patent Literature 3 and the Patent Literature 4 are described as follows.

The Patent Literature 3 and the Patent Literature 4 disclose a semiconductor memory apparatus, wherein at a beginning of a sensing action executed by a sense amplifier, given that an overdriving action is performed in a charge sharing mode, an array voltage may be increased, and a capacitance of a capacitor element used for an overdrive voltage may be decreased. A first internal power supply generating circuit generating an overdrive voltage VOD and a second internal power supply generating circuit generating an array voltage VARY are disposed in the semiconductor memory apparatus. Moreover, the first internal power supply generating circuit is connected to the sense amplifier during an overdrive period starting at the beginning of the sensing action and ending after a first time goes by, and the second internal power supply generating circuit is connected to the sense amplifier after the first time. The first internal power supply generating circuit is first set to be in an action state at the beginning of the sensing action and set to be in a non-action floating state after the capacitor element is charged.

Therefore, the Patent Literature 3 and the Patent Literature 4 disclose that a capacitance used for the overdrive voltage is fixed. Nevertheless, the features of the invention including changing the capacitance in the normal readout/write-in mode and in the automatic refreshing mode and trimming and optimizing the capacitance are neither disclosed nor taught in the Patent Literature 3 and the Patent Literature 4.

INDUSTRIAL APPLICABILITY

In view of the above detailed descriptions, in the semiconductor memory apparatus provided by the embodiments of the invention, the capacitance of the capacitor used for the overdrive voltage may be optimized, and the current consumed by the sense amplifier may be reduced in comparison with the existing technologies. Moreover, the invention (Embodiment 2 and Embodiment 3) is not limited to the memory circuit of the SDRAM and may be applied to the semiconductor memory apparatuses with the sense amplifiers, such as a flash memory, a static random access memory (SRAM), and so on.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A semiconductor memory apparatus, performing a selection action in a normal readout/write-in mode and in an automatic refreshing mode and comprising:
   a sense amplifier, having a first power supply intermediate node and a second power supply intermediate node and reading out data from a memory device connected to a word line and a bit line;
   a first switching device, connecting a first power supply voltage acting as an overdrive voltage to the first power supply intermediate node of the sense amplifier when the sense amplifier is driven during a first period and then connecting a second power supply voltage lower than the first power supply voltage and acting as an array voltage to the first power supply intermediate node of the sense amplifier when the sense amplifier is driven during a second period;
   a second switching device, connecting the predetermined fourth power supply voltage to the second power supply intermediate node of the sense amplifier when the sense amplifier is driven;
   a first capacitor, connected to the overdrive voltage and charging the overdrive voltage;
   a third switching device, switched on when the semiconductor memory apparatus is in the automatic refreshing mode; and
   a voltage generator, generating a third power supply voltage substantially identical to the first power supply voltage, the voltage generator applying the third power supply voltage and the first power supply voltage in parallel through the third switching device.

2. The semiconductor memory apparatus as claimed in claim 1, further comprising a second capacitor, the second capacitor being connected to the third power supply voltage and charging the third power supply voltage.

3. The semiconductor memory apparatus as claimed in claim 2, wherein if a number of the sense amplifier activated when the semiconductor memory device is in the automatic refreshing mode is configured to be A, a number of the sense amplifier activated when the semiconductor memory device is in the normal readout/write-in mode is configured to be N, a capacitance of the first capacitor is configured to be C1, and a capacitance of the second capacitor is configured to be C2, the capacitances C1 and C2 are configured to satisfy the following equation, $$A/N=(C1+C2)/C1.$$

4. The semiconductor memory apparatus as claimed in claim 1, wherein the third switching device is a metal oxide semiconductor (MOS) transistor.

5. The semiconductor memory apparatus as claimed in claim 2, wherein the third switching device has a driving capability to fully discharge electric charges of the second capacitor.

6. The semiconductor memory apparatus as claimed in claim 1, wherein the third switching device is switched on when the semiconductor memory apparatus is in the automatic refreshing mode and switched off when the semiconductor memory apparatus is in the normal readout/write-in mode according to a predetermined mode signal.

7. A semiconductor memory apparatus, comprising:
   a sense amplifier, having a first power supply intermediate node and a second power supply intermediate node and reading out data from a memory device connected to a word line and a bit line;
   a first switching device, during a first period when the sense amplifier is driven, the first switching device connecting a first power supply voltage acting as an overdrive voltage to the first power supply intermediate node of the sense amplifier and then connecting a second power supply voltage lower than the first power supply voltage and acting as an array voltage to the first power supply intermediate node;
   a second switching device, connecting the predetermined fourth power supply voltage to the second power supply intermediate node of the sense amplifier when the sense amplifier is driven;
   a first capacitor, connected to the overdrive voltage and charging the overdrive voltage;
   a plurality of third switching devices, each having one terminal connected to the first capacitor;
   a plurality of second capacitors, connected respectively to the other terminals of the third switching devices; and
   a control circuit, generating a plurality of control signals to control a switch-on action or a switch-off action of the third switching devices.

8. The semiconductor memory apparatus as claimed in claim 7, wherein the third switching devices are respectively MOS transistors.

9. The semiconductor memory apparatus as claimed in claim 7, wherein the third switching devices have a driving capability to fully charge or discharge electric charges of the second capacitors.

10. The semiconductor memory apparatus as claimed in claim 7, wherein the control circuit comprises a plurality of fuses and cuts off the predetermined fuses, so as to output a plurality of fuse signals acting as the control signals to the third switching devices.

11. The semiconductor memory apparatus as claimed in claim 7, wherein the control circuit outputs a plurality of internal testing signals acting as the control signals to the third switching devices during an internal testing of the semiconductor memory device.

12. The semiconductor memory apparatus as claimed in claim 7, wherein capacitances of the second capacitors are determined according to methods that are identical to or different from one another.

* * * * *